US010886729B2

(12) United States Patent
Chen

(10) Patent No.: US 10,886,729 B2
(45) Date of Patent: Jan. 5, 2021

(54) ELECTROSTATIC DISCHARGE PROTECTION DEVICE FOR HIGH SUPPLY VOLTAGE OPERATIONS

(71) Applicant: RichWave Technology Corp., Taipei (TW)

(72) Inventor: Yuh-Yue Chen, Taipei (TW)

(73) Assignee: RichWave Technology Corp., Taipei (TW)

( * ) Notice: Subject to any disclaimer, the term of this patent is extended or adjusted under 35 U.S.C. 154(b) by 396 days.

(21) Appl. No.: 15/973,544

(22) Filed: May 8, 2018

(65) Prior Publication Data
US 2018/0351352 A1 Dec. 6, 2018

Related U.S. Application Data

(60) Provisional application No. 62/513,447, filed on Jun. 1, 2017.

(51) Int. Cl.
*H02H 9/04* (2006.01)
*H01L 29/10* (2006.01)
(Continued)

(52) U.S. Cl.
CPC ......... *H02H 9/044* (2013.01); *H01L 27/0248* (2013.01); *H01L 27/0285* (2013.01);
(Continued)

(58) Field of Classification Search
CPC ............. H01L 27/0248; H01L 27/0285; H01L 27/0629; H01L 27/0922; H01L 29/1033;
(Continued)

(56) References Cited

U.S. PATENT DOCUMENTS 5,946,177 A * 8/1999 Miller ................. H01L 27/0248
361/56
6,294,943 B1 9/2001 Wall
(Continued)

FOREIGN PATENT DOCUMENTS

| CN | 106410773 A | 2/2017 |
|---|---|---|
| CN | 103219718 B | 5/2017 |
| TW | 201409654 A | 3/2014 |

*Primary Examiner* — Matthew V Nguyen
*Assistant Examiner* — Jye-June Lee
(74) *Attorney, Agent, or Firm* — Winston Hsu

(57) ABSTRACT

An electrostatic discharge protection device includes a voltage divider, a resistor, a capacitor, a first primary transistor, a second primary transistor, a first control circuit, and a second control circuit. The voltage divider is coupled between a first system terminal and a second system terminal for providing a voltage. The resistor is coupled to the first system terminal, and the capacitor is coupled to the resistor. The first primary transistor and the second primary transistor are coupled in series between the first system terminal and the second system terminal. The first control circuit turns on the first primary transistor when an electrostatic discharge event occurs according to voltages provided by the voltage divider and the resistor. The second control circuit turns on the second primary transistor when the electrostatic discharge event occurs according to voltages provided by the voltage divider and the first control circuit.

19 Claims, 12 Drawing Sheets

(51) Int. Cl.
  *H01L 27/06* (2006.01)
  *H01L 27/092* (2006.01)
  *H01L 27/02* (2006.01)
  *H01L 49/02* (2006.01)
  *H01L 29/93* (2006.01)

(52) U.S. Cl.
  CPC ...... *H01L 27/0629* (2013.01); *H01L 27/0922* (2013.01); *H01L 29/1033* (2013.01); *H01L 29/1095* (2013.01); *H02H 9/046* (2013.01); *H01L 28/20* (2013.01); *H01L 28/40* (2013.01); *H01L 29/93* (2013.01)

(58) Field of Classification Search
  CPC ..... H01L 29/1095; H01L 29/93; H01L 28/20; H01L 28/40; H02H 9/044; H02H 9/046
  See application file for complete search history.

(56) References Cited

U.S. PATENT DOCUMENTS

| | | | |
|---|---|---|---|
| 7,203,045 B2* | 4/2007 | Chatty | H01L 27/0266 361/111 |
| 7,545,614 B2* | 6/2009 | Traynor | H01L 27/0285 361/56 |
| 8,010,927 B2 | 8/2011 | Gauthier, Jr. | |
| 9,172,244 B1* | 10/2015 | Ma | H01L 27/0266 |
| 2008/0055805 A1 | 3/2008 | Pong | |
| 2010/0232078 A1* | 9/2010 | Bhattacharya | H01L 27/0266 361/56 |
| 2016/0071836 A1* | 3/2016 | Tsai | H01L 27/0266 361/56 |
| 2016/0079225 A1* | 3/2016 | Arakawa | H01L 27/0285 361/56 |

* cited by examiner

ELECTROSTATIC DISCHARGE PROTECTION DEVICE FOR HIGH SUPPLY VOLTAGE OPERATIONS

CROSS REFERENCE TO RELATED APPLICATION

This non-provisional application claims priority of U.S. provisional application No. 62/513,447, filed on Jun. 1, 2017, included herein by reference in its entirety.

TECHNICAL FIELD

This invention is related to an electrostatic discharge protection device, and more particularly, an electrostatic discharge protection device for high supply voltage operations.

BACKGROUND

As the sizes of the electronic components shrink, the operational voltages for the electronic components also become lower. For example, the modern core device may be operated under 1 Volt, and the input/output devices may be operated under 2 Volts. As a result, the power consumption is decreased accordingly. However, the electronic components also become more vulnerable to high voltages. Therefore, reliability concerns may be raised when these electronic components are operated under high supply voltages required by different circuits and applications in the system.

Nevertheless, the situation could be even more complicated when designing the electrostatic discharge (ESD) protection device manufactured with the same low voltage process. In this case, to endure the high operational voltages required by the circuit during normal operations, the discharging path provided by the ESD protection circuit usually contains more than one transistor to prevent the transistors from breaking down. However, the non-uniform turn-on nature built in stacked transistors may mitigate the turn-on efficiency of the ESD circuit. Furthermore, if the transistors are not turned on fast enough, the current to be discharged will penetrate into the vulnerable function blocks and cause damages.

SUMMARY

One embodiment of the present invention discloses an electrostatic discharge (ESD) protection device. The ESD protection device includes a voltage divider, a first resistor, a capacitor, a first primary transistor, a second primary transistor, a first control circuit, and a second control circuit.

The voltage divider is coupled to a first system terminal for receiving a first voltage and a second system terminal for receiving a second voltage. The voltage divider provides at least one voltage between the first voltage and the second voltage.

The first resistor has a first terminal coupled to the first system terminal, and a second terminal. The capacitor has a first terminal coupled to the second terminal of the first resistor, and a second terminal.

The first primary transistor has a first terminal coupled to the first system terminal, a second terminal, and a control terminal. The second primary transistor has a first terminal coupled to the second terminal of the first primary transistor, a second terminal coupled to the second system terminal, and a control terminal.

The first control circuit turns on the first primary transistor when an electrostatic discharge event occurs. The first control circuit includes a first terminal coupled to the first system terminal, an input terminal coupled to the second terminal of the first resistor, a second terminal coupled to the voltage divider for receiving a third voltage between the first voltage and the second voltage, and an output terminal coupled to the control terminal of the first primary transistor for controlling the first primary transistor.

The second control circuit turns on the second primary transistor when the electrostatic discharge event occurs. The second control circuit includes a first terminal coupled to the output terminal of the first control circuit, an input terminal coupled to the voltage divider for receiving the third voltage or a fourth voltage between the first voltage and the second voltage, a second terminal coupled to the second system terminal, and an output terminal coupled to the control terminal of the second primary transistor for controlling the second primary transistor.

DETAILED DESCRIPTION

Figure 1:
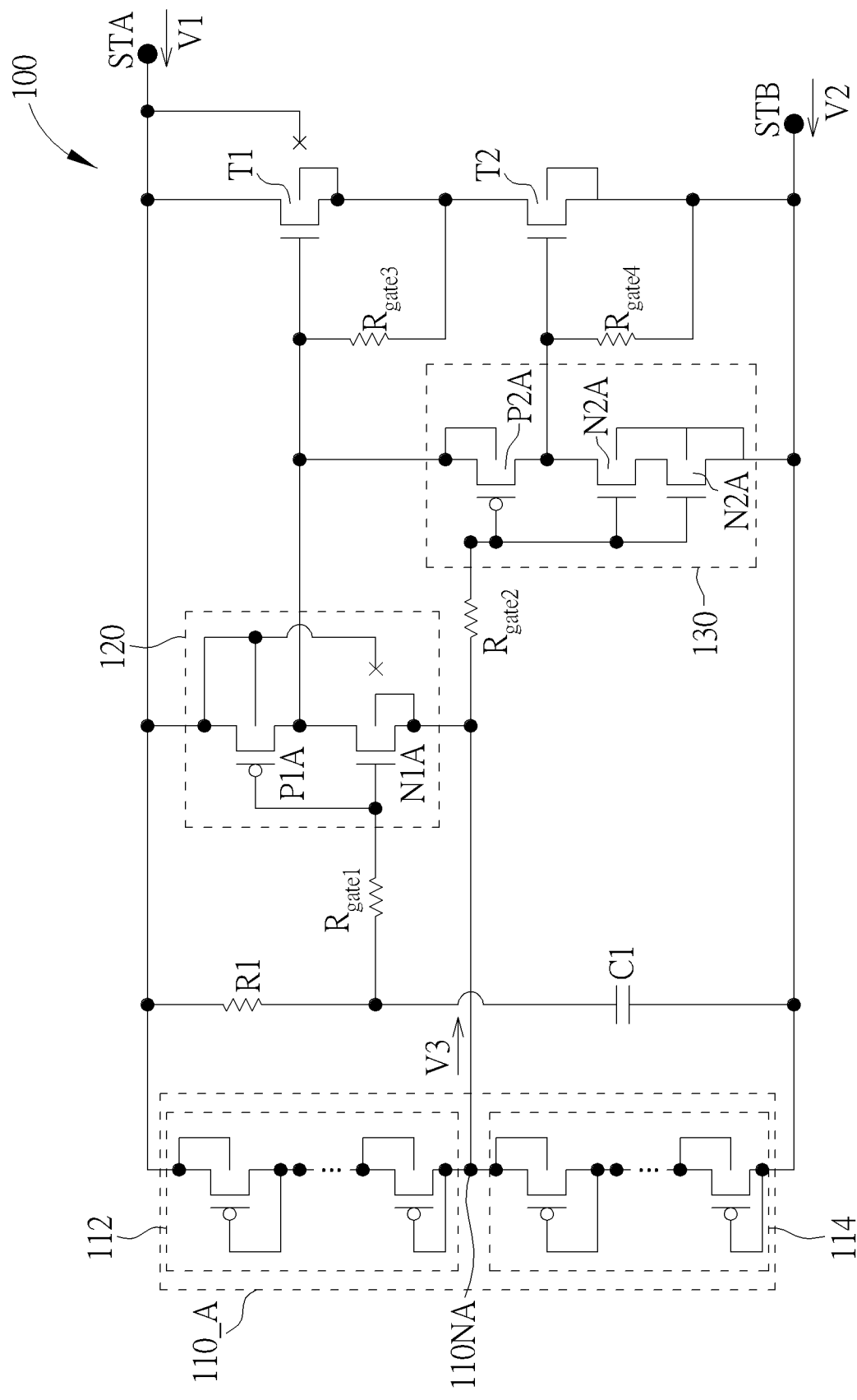
FIG. 1 shows an electrostatic discharge (ESD) protection device according to one embodiment of the present invention.

Below, exemplary embodiments will be described in detail with reference to accompanying drawings to be easily realized by a person having ordinary knowledge in the art. The inventive concept may be embodied in various forms without being limited to the exemplary embodiments set forth herein. Descriptions of well-known parts are omitted for clarity, and throughout the application like reference numerals refer to like elements.

FIG. 1 shows an electrostatic discharge (ESD) protection device 100 according to one embodiment of the present invention. The ESD protection device 100 includes a voltage divider 110_A, a first resistor R1, a capacitor C1, a first primary transistor T1, a second primary transistor T2, a first control circuit 120, and a second control circuit 130.

The voltage divider 110_A is coupled to a first system terminal STA for receiving a first voltage V1 and a second system terminal STB for receiving a second voltage V2. In some embodiments, the first voltage V1 can be the high operation voltage of the system while the second voltage V2 can be the reference voltage or the ground voltage of the system. In this case, the first voltage V1 is higher than the second voltage V2, and the voltage divider 110_A can provide a third voltage V3 between the first voltage V1 and the second voltage V2. In some embodiments, to release the cross voltages endured by the first primary transistor T1 and the second primary transistor T2, the voltage divider 110_A may divide the voltage domain into two balanced sub domains. For example, if the first voltage V1 is 5V, and the second voltage V2 is 0V, then the third voltage V3 can be 2.5V.

The first resistor R1 has a first terminal coupled to the first system terminal STA, and a second terminal. The capacitor C1 has a first terminal coupled to the second terminal of the first resistor R1, and a second terminal coupled to the second system terminal STB. In some embodiments, the capacitor C1 can be implemented by, for example but not limited to, a metal-oxide-metal (MOM) capacitor or a metal-insulator-metal (MIM) capacitor for better isolation and enhancing the reliability.

However, in some embodiments, the second terminal of the capacitor C1 can receive the third voltage V3, instead of coupling to the second system terminal STB. In this case, the cross voltage on the capacitor C1 would be smaller; therefore, the capacitor C1 can be implemented by an N-type transistor, a P-type transistor, or a metal-oxide-semiconductor varactor. Also, a metal-oxide-metal capacitor or a metal-insulator-metal capacitor is still applicable for the capacitor C1 in this case.

The first primary transistor T1 has a first terminal coupled to the first system terminal STA, a second terminal, and a control terminal. The second primary transistor T2 has a first terminal coupled to the second terminal of the first primary transistor T1, a second terminal coupled to the second system terminal STB, and a control terminal.

The first control circuit 120 includes a first terminal coupled to the first system terminal STA, an input terminal coupled to the second terminal of the first resistor R1, a second terminal coupled to the voltage divider 110_A for receiving the third voltage V3, and an output terminal coupled to the control terminal of the first primary transistor T1 for controlling the first primary transistor T1.

In FIG. 1, the first control circuit 120 includes a first P-type transistor P1A and a first N-type transistor N1A. The first P-type transistor P1A has a first terminal coupled to the first terminal of the first control circuit 120, a second terminal coupled to the output terminal of the first control circuit 120, and a control terminal coupled to the input terminal of the first control circuit 120. The first N-type transistor N1A has a first terminal coupled to the second terminal of the first P-type transistor P1A, a second terminal coupled to the second terminal of the first control circuit 120, and a control terminal coupled to the input terminal of the first control circuit 120.

The second control circuit 130 includes a first terminal coupled to the output terminal of the first control circuit 120, an input terminal coupled to the voltage divider 110_A for receiving the third voltage V3, a second terminal coupled to the second system terminal STB, and an output terminal coupled to the control terminal of the second primary transistor T2 for controlling the second primary transistor T2.

In FIG. 1, the second control circuit 130 includes a second P-type transistor P2A and a plurality of second N-type transistors N2A. The second P-type transistor P2A has a first terminal coupled to the output terminal of the first control circuit 120, a second terminal coupled to the output terminal of the second control circuit 130, and a control terminal coupled to the input terminal of the second control circuit 130. The second N-type transistors N2A are coupled in series between the output terminal of the second control circuit 130 and the second system terminal STB with control terminals of the second N-type transistors N2A coupled to the input terminal of the second control circuit 130.

During the normal operations, the first system terminal STA should be at the first voltage V1 stably. In this case, the capacitor C1 substantially can be seen as an open circuit so the voltage at the second terminal of the first resistor R1 would be pulled up to the first voltage V1. Therefore, the first P-type transistor P1A is turned off, the first N-type transistor is turned on, and the voltage at the control terminal of the first primary transistor T1 is pulled down to near the third voltage V3 through the first N-type transistor N1A. That is, during the normal operation, the first control circuit 120 can behave as an inverter, and the first primary transistor T1 would be turned off.

In addition, since the input terminal of the second control circuit 130 also receives the third voltage V3, the second P-type transistor P2A would be turned off and the second N-type transistors N2A would be turned on. Therefore, the voltage at the control terminal of the second primary transistor T2 is pulled down to near the second voltage V2 through the second N-type transistors N2A. That is, during the normal operation, the second control circuit 130 can behave as an inverter, and the second primary transistor T2 would be turned off. Consequently, during the normal operations, the first primary transistor T1 and the second primary transistor are both turned off, preventing the ESD protection device 100 from generating leakage currents.

However, when an electrostatic discharge event occurs, the voltage at the first system terminal STA would be raised drastically in a short period of time. Therefore, the capacitor C1 can be substantially seen as a short circuit so the voltage at the second terminal of the first resistor R1 would be pulled down to the second voltage V2. As a result, the first P-type transistor P1A is turned on, the first N-type transistor N1A is turned off, and the voltage at the control terminal of the first primary transistor T1 is pulled up to a high voltage close to the first voltage V1, turning on the first primary transistor T1.

In this case, since the third voltage V3 is lower than the first voltage V1, the second P-type transistor P2A would be turned on, pulling up the voltage at the control terminal of the second primary transistor T2. Therefore, the second primary transistor T2 is turned on, and a discharge path can be formed by the first primary transistor T1 and the second primary transistor T2 when the electrostatic discharge event occurs. In addition, the voltage at the first terminal of the second P-type transistor P2A outputted from the output terminal of the first control circuit 120 can be lower than the first voltage V1, so the voltage at the control terminal of the second primary transistor T2 could also be lower, improving the reliability.

Moreover, since the third voltage V3 is higher than the second voltage V2, the second N-type transistors N2A can also be turned on. That is, the second P-type transistor P2A and the second N-type transistors N2A in the second control circuit 130 can all be turned on during a period of time, providing another discharge path from the first system terminal STA to the second system terminal STB through the first P-type transistor P1A, the second P-type transistor P2A, and the second N-type transistors N2A.

To ensure the second P-type transistor P2A can be turned on easily so that the second primary transistor T2 can be turned on accurately and instantly, the second P-type transistor P2A can have rather small channel length and rather big channel width. Also, to keep the second N-type transistors N2A turned on longer for providing the discharging path effectively, the second N-type transistors N2A can have rather big channel length and rather short channel width. That is, the second P-type transistor P2A would be relatively easier to be turned on, and the second N-type transistors N2A would be relatively more difficult to be turned off.

In some embodiments, the channel length of the second P-type transistor P2A can be smaller than the channel length of each of the second N-type transistors N2A, and the channel width of the second P-type transistor P2A can be greater than the channel width of each of the second N-type transistors N2A.

Similarly, the channel length of the first P-type transistor P1A can be smaller than the channel length of the first N-type transistor N1A, and the channel width of the first P-type transistor P1A can be greater than a channel width of the first N-type transistor N1A.

Consequently, the ESD protection device 100 is able to provide protection with high turn-on speed and good current leakage control for high operation voltage circuits.

Furthermore, in FIG. 1, the first N-type transistor N1A is disposed in a deep N-well coupled to the first terminal of the first control circuit 120. In addition, the body terminal of the first P-type transistor P1A is coupled to the first terminal of the first control circuit 120, and the body terminal of the first N-type transistor N1A is coupled to the second terminal of the first N-type transistor N1A. Therefore, the first P-type transistor P1A and the first N-type transistor N1A can be isolated, reducing the leakage current.

Similarly, the body terminals of the second N-type transistors N2A are coupled to the second system node STB. In addition, when the ESD protection device 100 is made by CMOS process, the first primary transistor T1 can be disposed in a deep N-well coupled to the first system terminal STA, the body terminal of the first primary transistor T1 can coupled to the second terminal of the first primary transistor T1, and the body terminal of the second primary transistor T2 can be coupled to the second terminal of the second primary transistor T2.

In addition, in FIG. 1, to further secure the turn-on window, the input terminal of the first control circuit 120 can be coupled to the second terminal of the first resistor R1 through a first gate resistor $R_{gate1}$. With the first gate resistor $R_{gate1}$, the first P-type transistor P1A would be turned on faster while the first N-type transistor N1A would be turned off slower. That is, with the first gate resistor $R_{gate1}$, the turn-on/turn-off timing window can be adjusted accordingly.

Similarly, in FIG. 1, the ESD protection device 100 can further include a second gate resistor $R_{gate2}$ coupled between the input terminal of the second control circuit 130 and the voltage divider 110_A.

Also, the ESD protection device 100 can further include a third gate transistor resistor $R_{gate3}$ coupled between the control terminal of the first primary transistor T1 and the second terminal of the first primary transistor T1, and a fourth gate transistor resistor $R_{gate4}$ coupled between the control terminal of the second primary transistor T2 and the second terminal of the second primary transistor T2. With the gate resistors $R_{gate3}$ and $R_{gate4}$, the leakage current caused by an abrupt and surge voltage during power-up process can be eliminated.

However, in some embodiments, if the practical condition permits, at least one of the gate resistors $R_{gate1}$, $R_{gate2}$, $R_{gate3}$ and $R_{gate4}$ can be omitted.

Figure 2:
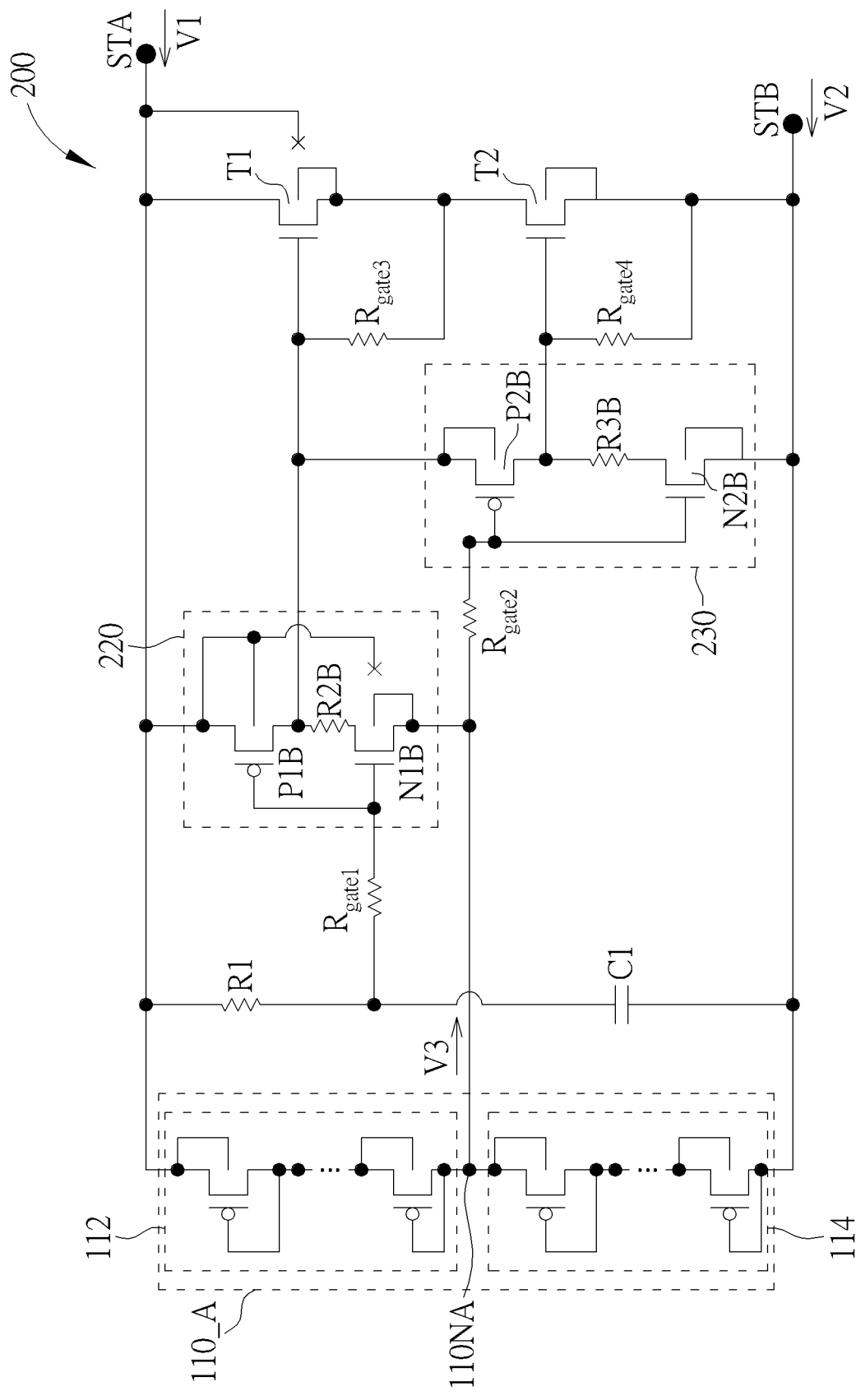
FIG. 2 shows an ESD protection device according to another embodiment of the present invention.

FIG. 2 shows an ESD protection device 200 according to another embodiment of the present invention. The ESD protection devices 100 and 200 have similar structures and can be operated with similar principles. However, in addition to the first P-type transistor P1B and the first N-type transistor N1B, the first control circuit 220 further includes a second resistor R2B coupled between the first terminal of the first N-type transistor N1B and the output terminal of the first control circuit 220. With the second resistor R2B, the turn-on period of the first primary transistor T1 can last longer when the ESD event occurs, and the leakage current caused during the normal operations can also be reduced.

Similarly, the second control circuit 230 of the ESD protection device 200 may also include a third resistor R3B at the output terminal of the second control circuit 230. In FIG. 2, the second control circuit 230 includes a second P-type transistor P2B, a second N-type transistor N2B, and the third resistor R3B.

The second P-type transistor P2B has a first terminal coupled to the output terminal of the first control circuit 220, a second terminal coupled to the output terminal of the second control circuit 230, and a control terminal coupled to the input terminal of the second control circuit 230. The second N-type transistor N2B has a first terminal coupled to the output terminal of the second control circuit 230, a second terminal coupled to the second system terminal STB, and a control terminal coupled to the input terminal of the second control circuit 230. The third resistor R3B is coupled between the first terminal of the second N-type transistor N2B and the output terminal of the second control circuit 230.

With the voltage drop provided by the third resistor R3B, the second N-type transistor N2B would be harder to be turned off, preventing the second primary transistor T2 from being turned off too quickly when the ESD event occurs. In this case, the second control circuit 230 can use one single second N-type transistor N2B instead of a series of second N-type transistors N2A used in the second control circuit 130, and can still achieve the similar function. However, in some embodiments, by choosing sizes of the second P-type transistor P2B and the second N-type transistor N2B properly according to the required turn-on window of the second primary transistor T2, the third resistor R3A may be omitted. Also, in some embodiments, the second control circuit 230 may also include more second N-type transistors N2B coupled in series according to the system requirements.

Figure 3:
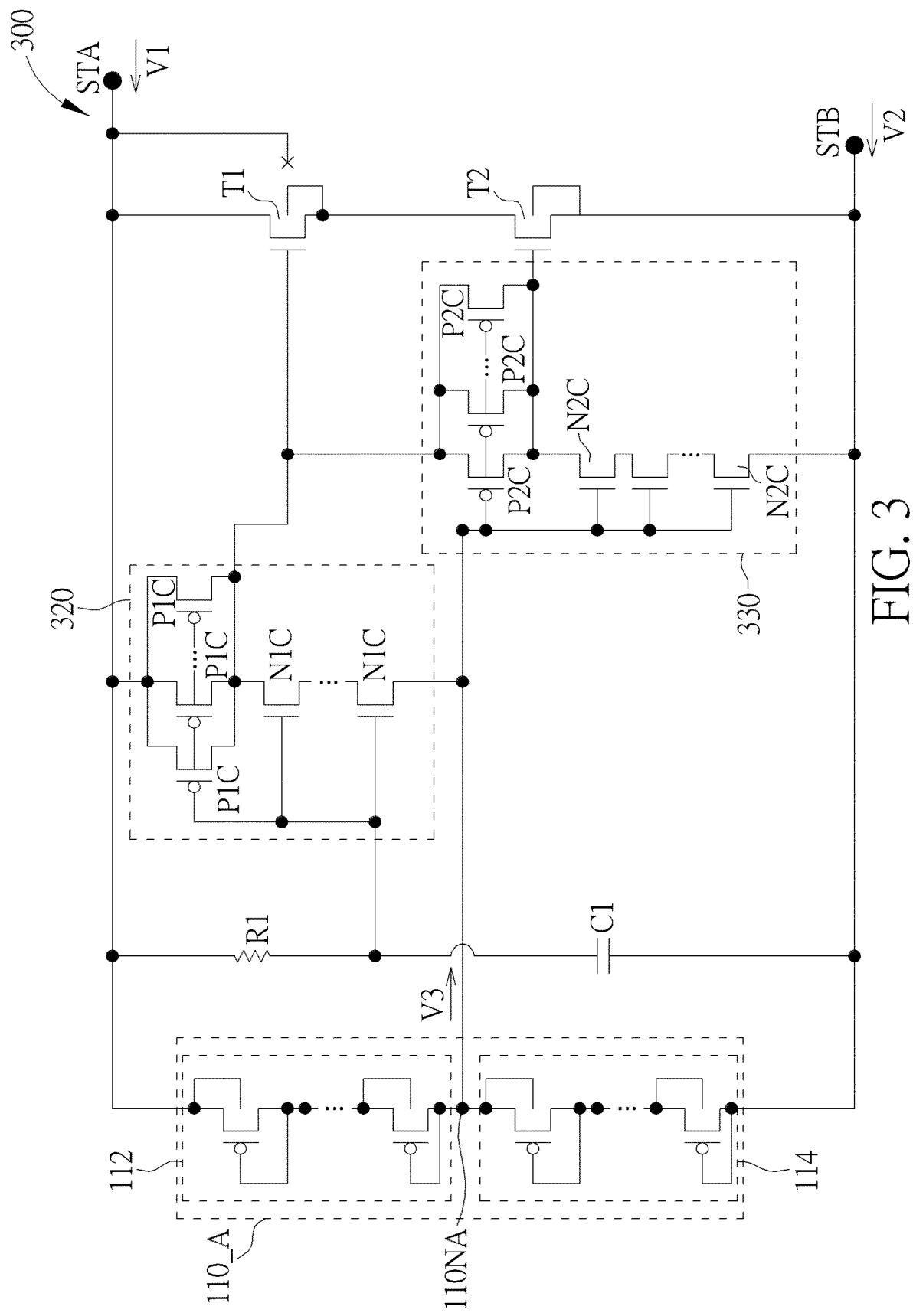
FIG. 3 shows an ESD protection device according to another embodiment of the present invention.

FIG. 3 shows an ESD protection device 300 according to another embodiment of the present invention. The ESD protection devices 100 and 300 have similar structures and can be operated with similar principles. However, the first control circuit 320 of the ESD protection device 300 includes a plurality of first P-type transistors P1C and a plurality of first N-type transistors N1C.

Each of the first P-type transistors P1C has a first terminal coupled to the first terminal of the first control circuit 320, a second terminal coupled to the output terminal of the first control circuit 320, and a control terminal coupled to the input terminal of the first control circuit 320. Each of the first N-type transistors N1C is coupled in series between the output terminal and the second terminal of the first control circuit 320 with control terminals of the plurality of first N-type transistors N1C coupled to the input terminal of the first control circuit 320.

Since each of the first P-type transistors P1C can provide a current path while all of the first N-type transistors N1C are on the same current path, the effective channel width of the first P-type transistors P1C would be greater than the effective channel width of the first N-type transistors N1C, and the effective channel length of the first P-type transistors P1C would be smaller than the effective channel length of the first N-type transistors N1C. Therefore, the first P-type transistors P1C would be inclined to turn on the first primary transistor T1 faster while the first N-type transistors N1C would be inclined to turn off the first primary transistor T1 slower, preserving the turn-on window for the first primary transistor T1.

Similarly, the second control circuit 330 can include a plurality of second P-type transistors P2C and a plurality of second N-type transistors N2C. Each of the second P-type transistors P2C, has a first terminal coupled to the first terminal of the second control circuit 330, a second terminal coupled to the output terminal of the second control circuit 330, and a control terminal coupled to the input terminal of the second control circuit 330. The second N-type transistors N2C are coupled in series between the output terminal of the second control circuit 330 and the second system terminal STB with control terminals of the second N-type transistors N2C coupled to the input terminal of the second control circuit 330.

Also, for the purpose of isolation and leakage current control, each of the first N-type transistors N1C can be disposed in a deep N-well coupled to the first terminal of the first control circuit 320, and the body terminals of each of the first N-type transistors N1C can be coupled to its second source terminal as shown in FIG. 3. In addition, the body terminals of first P-type transistors P1C can be coupled to the first terminal of the first control circuit 320.

Similarly, each of the second N-type transistors N2C can be disposed in a deep N-well coupled to the first system terminal STA, and each of the second N-type transistors N2C has a body terminal coupled to its second terminal (source terminal). In addition, the body terminals of the second P-type transistors P2C are coupled to the first system terminal STA.

In FIG. 1, the voltage divider 110_A includes a first voltage gap circuit 112 and a second voltage gap circuit 114. The first voltage gap circuit 110_A is coupled to the first system terminal STA and a first intermediate node 110NA for providing the third voltage V3. The second voltage gap circuit 114 is coupled to the first intermediate node 110NA and the second system terminal STB. Furthermore, in this case, the input terminal of the second control circuit 130 can be coupled to the first intermediate node 110NA for receiving the third voltage V3.

Figure 4:
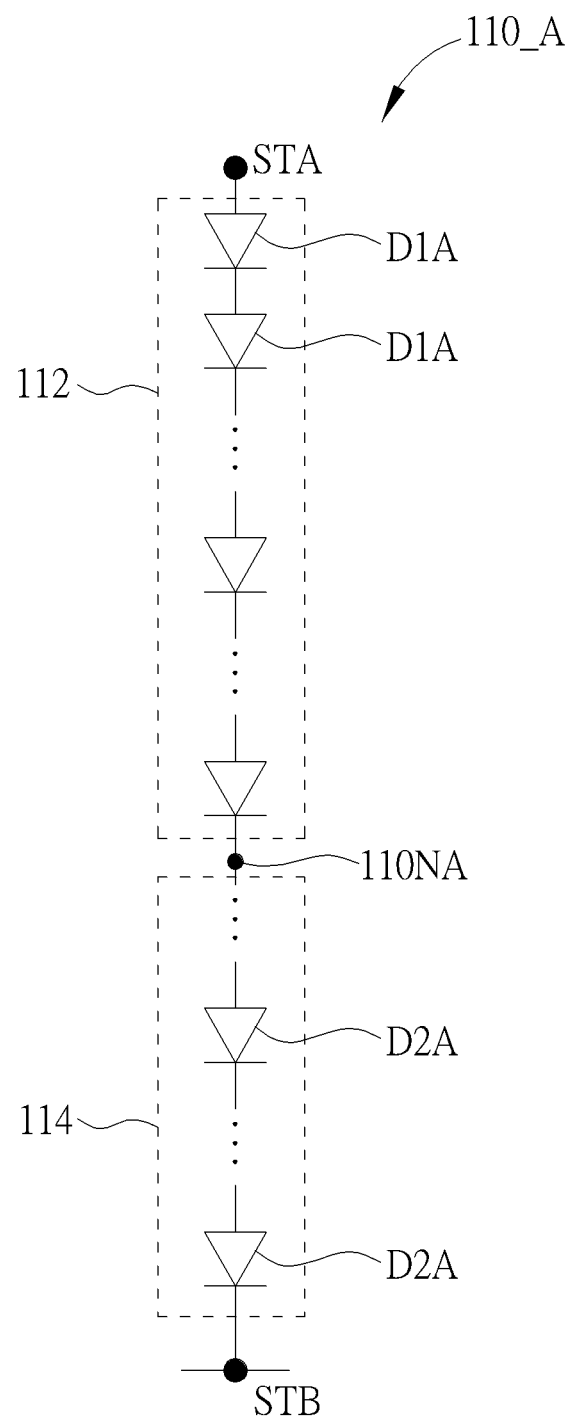
FIG. 4 shows the voltage divider according to one embodiment of the present invention.

FIG. 4 shows the voltage divider 110_A according to one embodiment of the present invention. In FIG. 4, the first voltage gap circuit 112 includes at least one first diode D1A coupled in series between the first system terminal STA and the first intermediate node 110NA, and the second voltage gap circuit 114 includes at least one second diode D2A coupled in series between the first intermediate node 110NA and the second system terminal STB. Furthermore, in FIG. 4, the first diodes D1A are forward biased, and the second diodes D2A are forward biased. In some embodiments, the forward voltage of the first diodes D1A and the second diodes D2A may have the similar values such as 0.7V. Therefore, by using proper numbers of the first diodes D1A and the second diodes D2A, the third voltage V3 can be provided as required.

However, in some other embodiments, the desired third voltage V3 can also be generated with the first diode D1A being reverse biased, and the second diode D2A being reverse biased.

Figure 5:
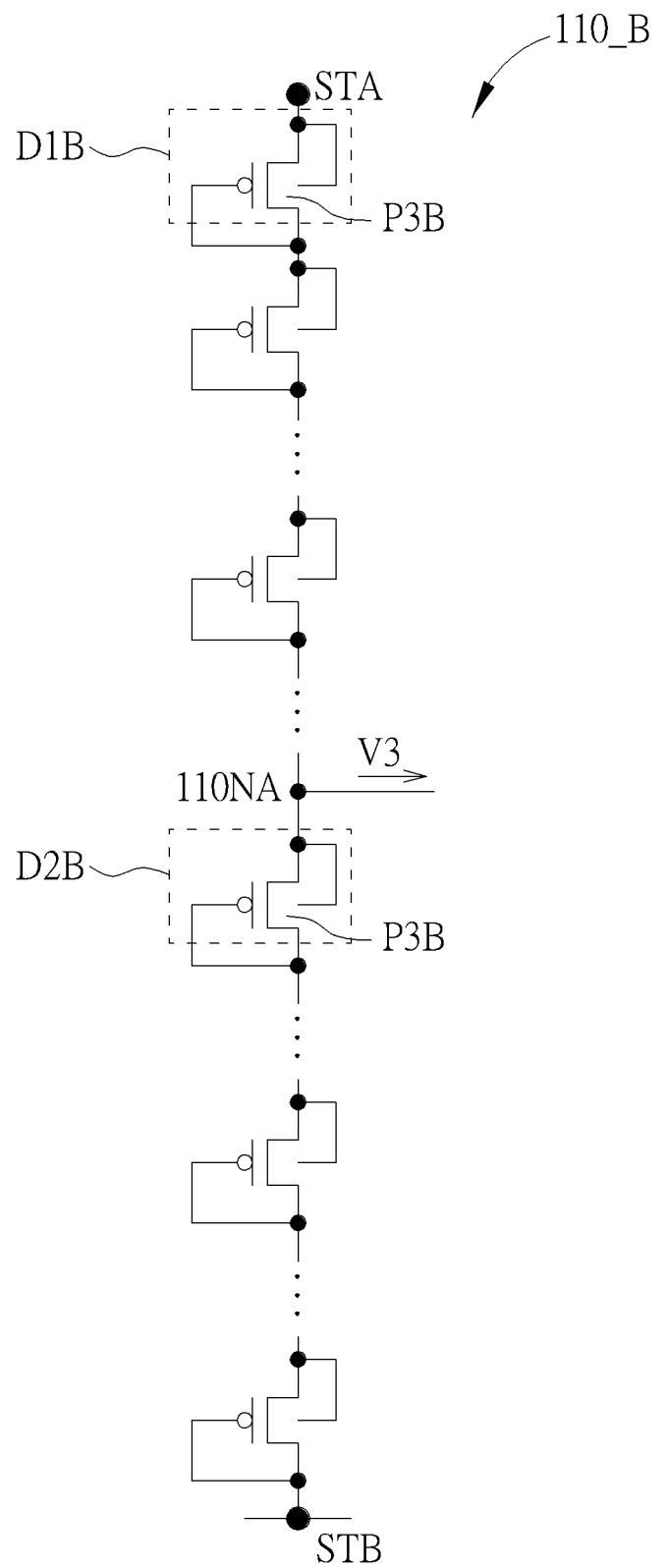
FIG. 5 shows the voltage divider according to another embodiment of the present invention.

FIG. 5 shows a voltage divider 110_B according to one embodiment of the present invention. In some embodiments, the voltage divider 110_B can be used in the ESD protection device 100 to replace the voltage divider 110_A.

In FIG. 5, the first diodes D1B and the second diodes D2B are implemented by third P-type transistors P3B. In FIG. 5, the third P-type transistors P3B are diode-connected. That is, the control terminal of the third P-type transistor P3B can be coupled to a second terminal of the third P-type transistor P3B. In this case, the body terminal of the third P-type transistor P3B can be coupled to the first terminal of the third P-type transistor P3B as shown in FIG. 5 for preventing leakage current flow through the N-wells of the third P-type transistors P3B. However, in some other embodiments, the body terminals of the third P-type transistors P3B can also be coupled to the first system terminal STA.

Figure 6:
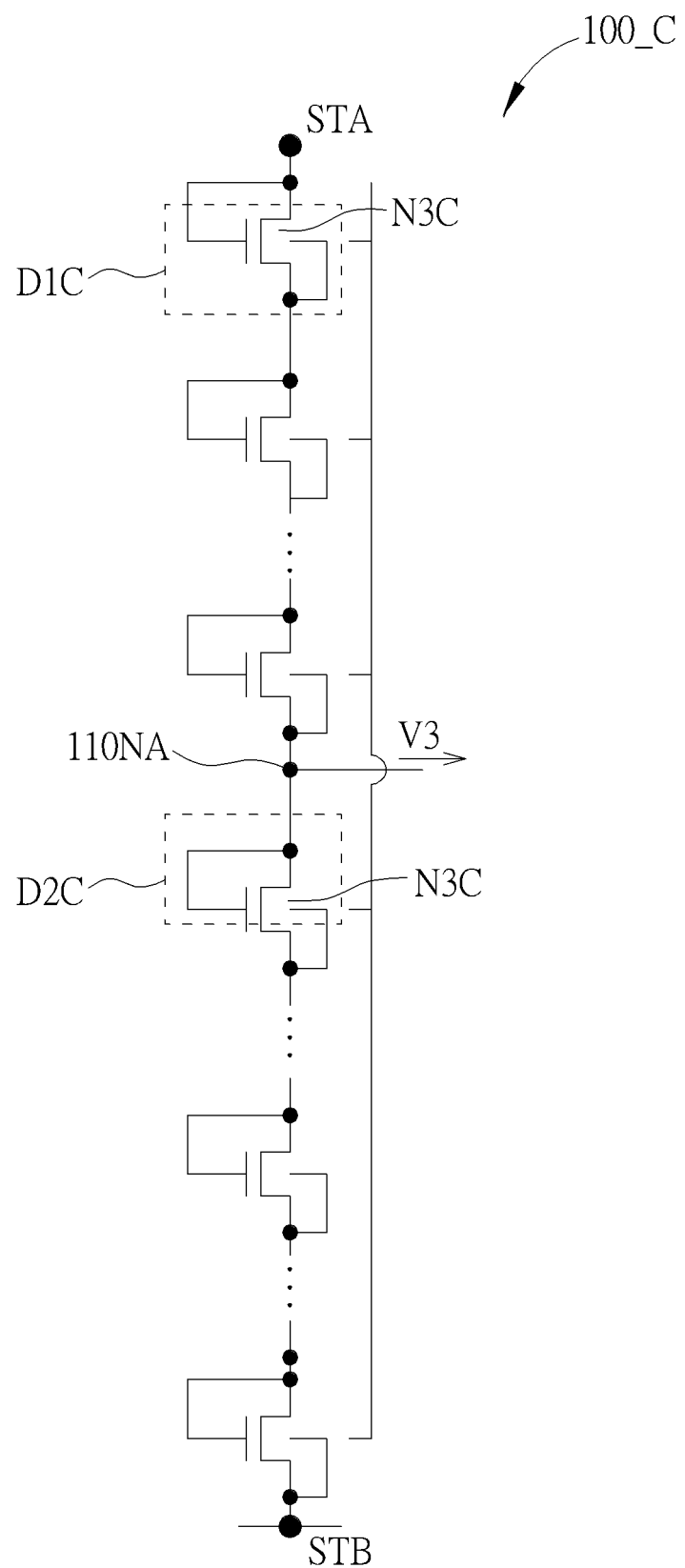
FIG. 6 shows the voltage divider according to another embodiment of the present invention.

FIG. 6 shows a voltage divider 110_C according to one embodiment of the present invention. In some embodiments, the voltage divider 110_C can be used in the ESD protection device 100 to replace the voltage divider 110_A.

In FIG. 6, the first diodes D1C and the second diodes D2C are implemented by third N-type transistors N3C. In FIG. 5, the third N-type transistors N3C are diode-connected. That is, the control terminal of the third N-type transistor N3C can be coupled to a first terminal of the third N-type transistor N3C. In this case, the body terminal of the third N-type transistor N3C can be coupled to the second terminal of the third N-type transistor N3C as shown in FIG. 6 to prevent leakage current. In addition, in FIG. 6, the third N-type transistors N3C can be disposed in deep N-wells coupled to the first system terminal STA for isolation. However, in some other embodiments, each third N-type transistor N3C can be disposed in a deep N-well coupled to its first terminal.

Figure 7:
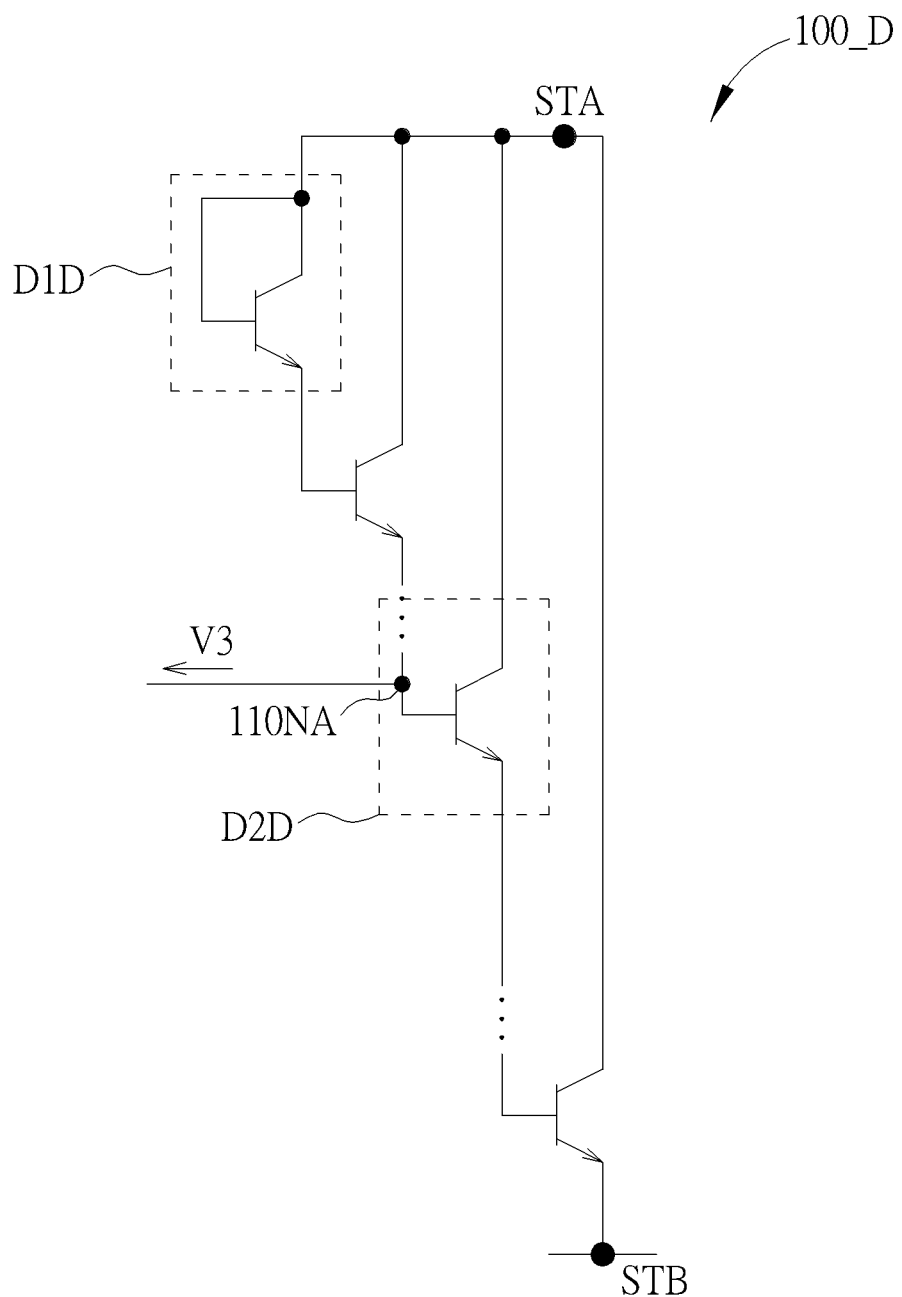
FIG. 7 shows the voltage divider according to another embodiment of the present invention.
Figure 8:
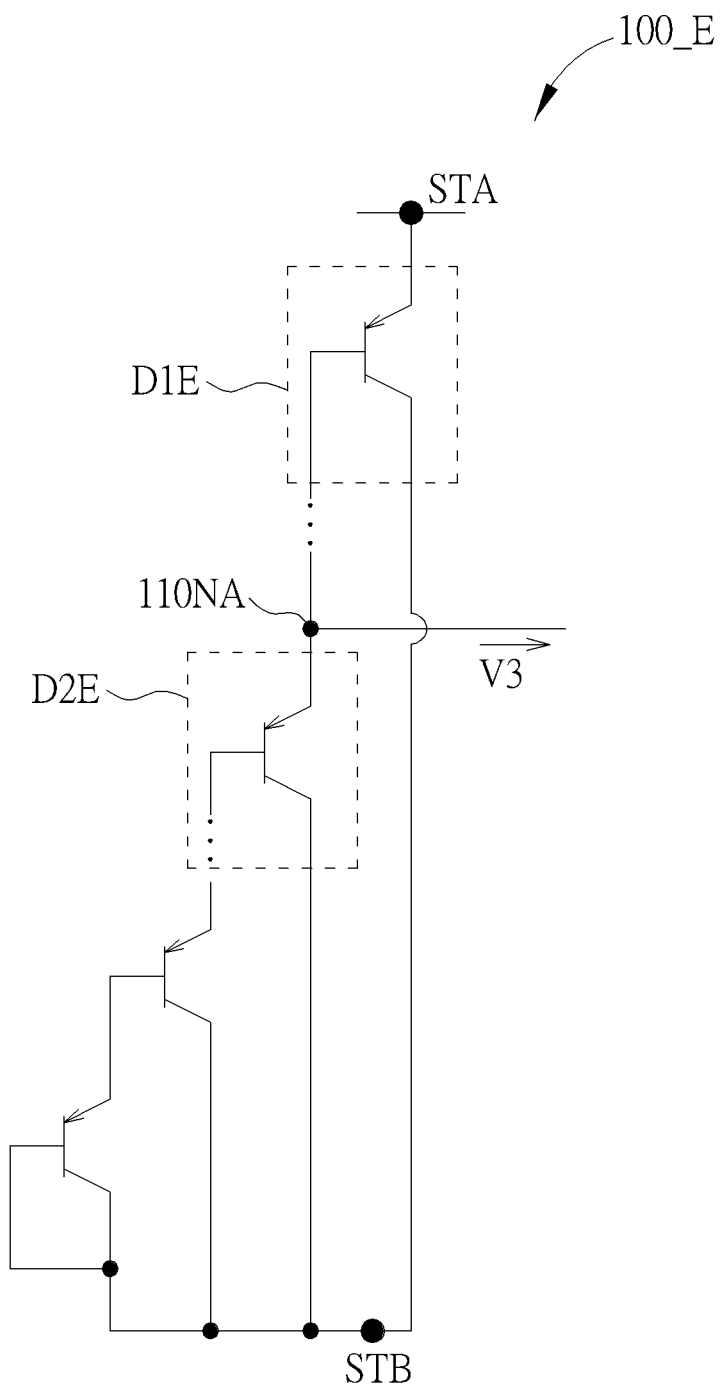
FIG. 8 shows the voltage divider according to another embodiment of the present invention.

In addition, the voltage divider can also be implemented by bipolar junction transistors. FIG. 7 shows a voltage divider 110_D according to another embodiment, and FIG. 8 shows a voltage divider 110_E according to another embodiment. In FIG. 7, the first diodes D1D and the second diodes D2D are implemented by NPN transistors while in FIG. 8, the first diodes D1E and the second diodes D2E are implemented by PNP transistors.

Figure 9:
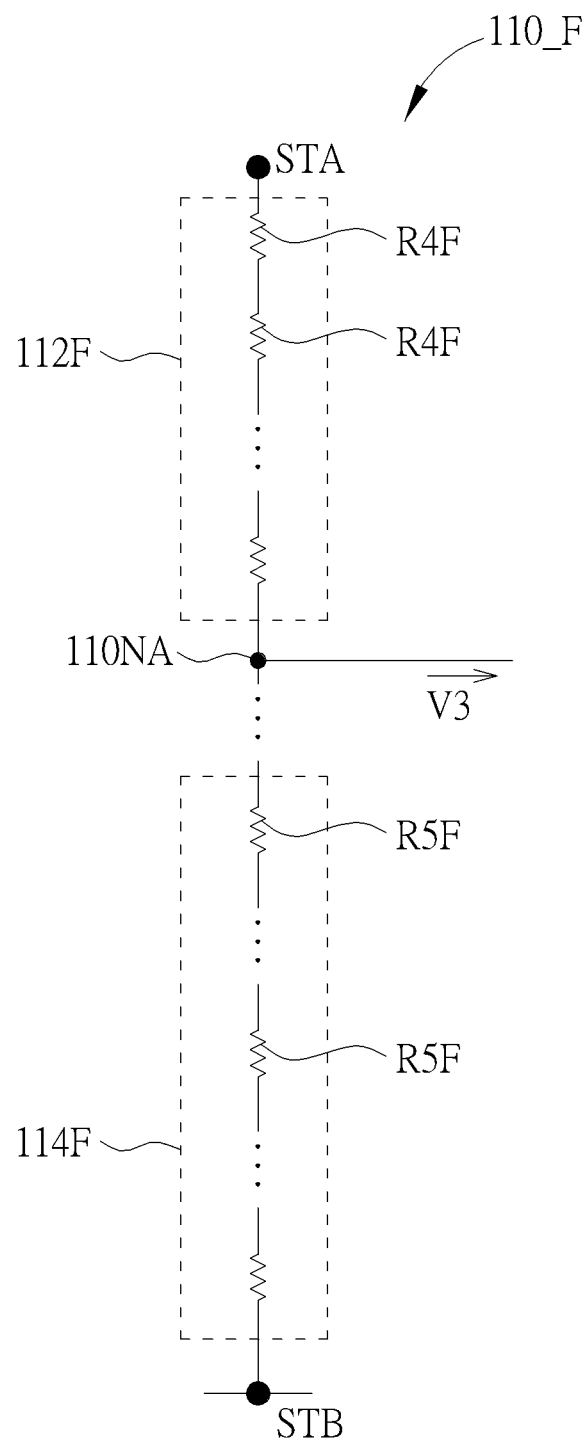
FIG. 9 shows the voltage divider according to another embodiment of the present invention.

Although diodes and transistors can be used to build the voltage gap circuits, it is not to limit the present invention. In some other embodiments, the resistors can be used to build the voltage gap circuits. FIG. 9 shows a voltage divider 110_E. The voltage divider 110_E can be used in the ESD protection device 100 to replace the voltage divider 110_A.

In FIG. 9, the voltage divider 110_F includes the first voltage gap circuit 112_F and the second voltage gap circuit 114_F. The first voltage gap circuit 112_F includes at least one fourth resistor R4F coupled in series between the first system terminal STA and the first intermediate node 110NA, and the second voltage gap circuit 114_F includes at least one fifth resistor R5F coupled in series between the first intermediate node 110NA and the second system terminal STB. That is, by using the resistor R4F and R5F to divide the voltage gap between the first voltage V1 and the second voltage V2, the third voltage V3 can be generated.

Figure 10:
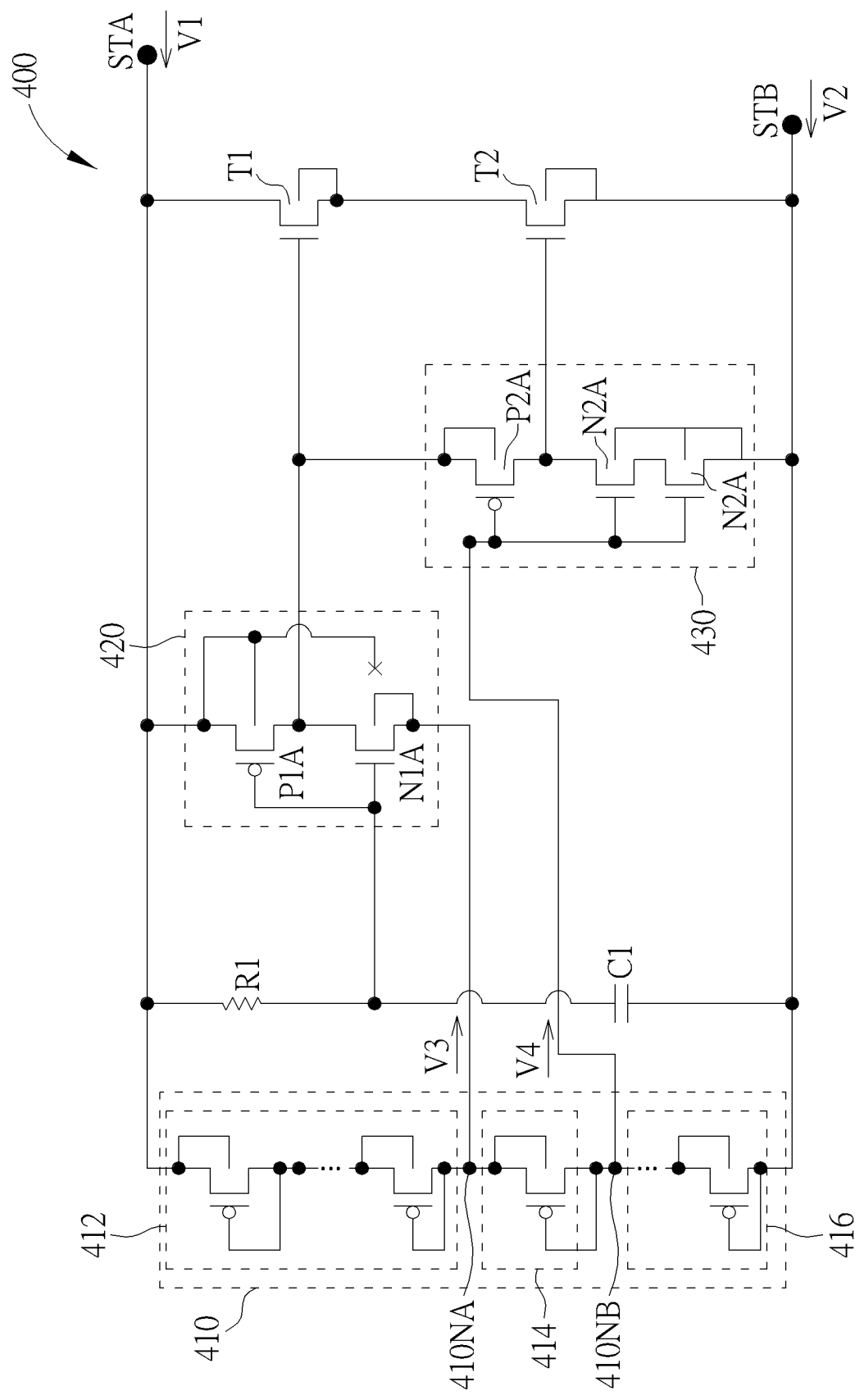
FIG. 10 shows an ESD protection device according to another embodiment of the present invention.

FIG. 10 shows an ESD protection device 400 according to another embodiment of the present invention. The ESD protection devices 100 and 400 have similar structures and can be operated with similar principles. However, in the ESD protection device 400, the second terminal of the first control circuit 420 receives the third voltage V3 while the input terminal of the second control circuit 430 receives a fourth voltage V4 lower than the third voltage. The fourth voltage V4 can ensure the second N-type transistors N2A and the second P-type transistor P2A to both be turned on during a period of time when the ESD event occurs, and ensure that the voltage at the second primary transistor T2 would be lower than the voltage at the first primary transistor T1, enhancing the durability of the ESD protection device 400.

In addition, in this case, the voltage divider 410 can provide both the third voltage V3 and the fourth voltage V4 by dividing the voltage between the first voltage V1 and the second voltage V2. For example, the voltage divider 410 may include a first voltage gap circuit 412, a second voltage gap circuit 414, and a third voltage gap circuit 416. The first voltage gap circuit 412 is coupled to the first system terminal STA and a first intermediate node 410NA for providing the third voltage V3. The second voltage gap circuit 414 is coupled to the first intermediate node 410NA and a second intermediate node 410NB for providing the fourth voltage V4. Furthermore, the third voltage gap circuit 416 can be coupled to the second intermediate node 410NB and the second system terminal STB, and the input terminal of the second control circuit 430 would be coupled to the second intermediate node 410NB for receiving the fourth voltage V4.

Although the ESD protection devices 100 to 400 are implemented with two primary transistors T1 and T2, this is not to limit the present invention. In some other embodiments, the ESD protection device may adopt more primary transistors for higher voltage domain with the similar control circuits shown in ESD protection devices 100 to 400.

In addition, although each of the first control circuits 120 to 420 and the second control circuits 130 to 430 may adopt one set of P-type transistor and N-type transistor(s), in some other embodiments, the first control circuit and the second control circuit may include more sets of P-type transistor and N-type transistor.

Figure 11:
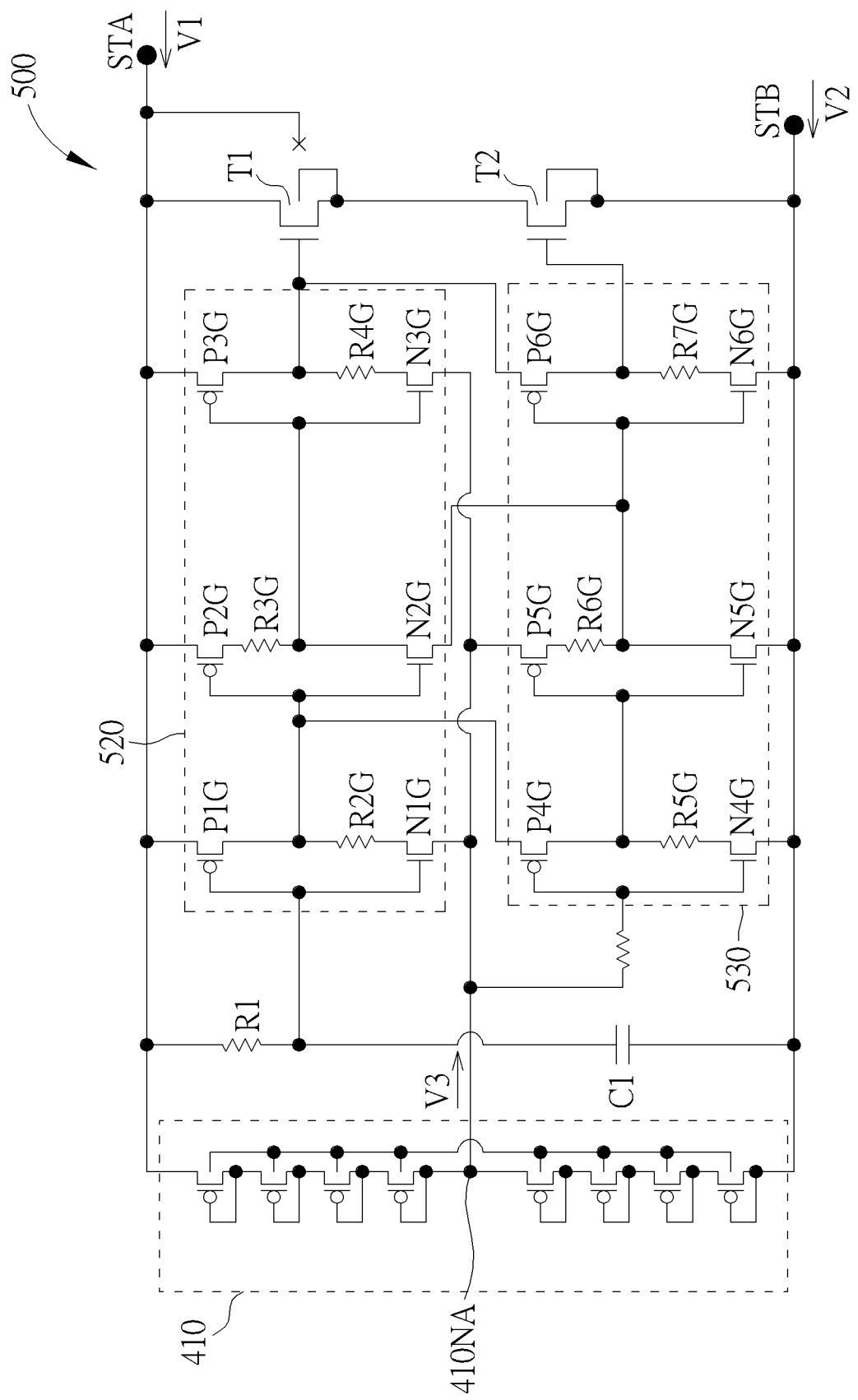
FIG. 11 shows an ESD protection device according to another embodiment of the present invention.

FIG. 11 shows an ESD protection device 500 according to one embodiment of the present invention. The ESD protection devices 200 and 500 have similar structures and can be operated with similar principles. However, the first control circuit 520 and the second control circuit 530 have more sets of P-type transistors and N-type transistors.

The first control circuit 520 includes a first P-type transistor P1G, a second resistor R2G, a first N-type transistor N1G, a second P-type transistor P2G, a third resistor R3G, a second N-type transistor N2G, a third P-type transistor P3G, a fourth resistor R4G, and a third N-type transistor N3G.

The first P-type transistor P1G has a first terminal coupled to the first terminal of the first control circuit 520, a second terminal, and a control terminal coupled to the input terminal of the first control circuit 520. The second resistor R2G has a first terminal coupled to the second terminal of the first P-type transistor P1G, and a second terminal. The first N-type transistor N1G has a first terminal coupled to the second terminal of the second resistor R2G, a second terminal coupled to the second terminal of the first control circuit 520, and a control terminal coupled to the input terminal of the first control circuit 520.

The second P-type transistor P2G has a first terminal coupled to the first terminal of the first control circuit 520, a second terminal, and a control terminal coupled to the first terminal of the second resistor R2G. The third resistor R3G has a first terminal coupled to the second terminal of the second P-type transistor P2G, and a second terminal. The second N-type transistor N2G has a first terminal coupled to the second terminal of the third resistor R3G, a second terminal, and a control terminal coupled to the first terminal of the second resistor R2G.

The third P-type transistor P3G has a first terminal coupled to the first terminal of the first control circuit 520, a second terminal coupled to the output terminal of the first control circuit 520, and a control terminal coupled to the second terminal of the third resistor R3G. The fourth resistor R4G has a first terminal coupled to the second terminal of the third P-type transistor P3G, and a second terminal. The third N-type transistor N3G has a first terminal coupled to the second terminal of the fourth resistor R4G, a second terminal coupled to the second terminal of the first control circuit 520, and a control terminal coupled to the second terminal of the third resistor R3G.

The second control circuit 530 includes a fourth P-type transistor P4G, a fifth resistor R5G, a fourth N-type transistor N4G, a fifth P-type transistor P5G, a sixth resistor R6G, a fifth N-type transistor N5G, a sixth P-type transistor P6G, a seventh resistor R7G, a sixth N-type transistor N6G.

The fourth P-type transistor P4G has a first terminal coupled to the first terminal of the second resistor R2G, a second terminal, and a control terminal coupled to the input terminal of the second control circuit 530. The fifth resistor R5G has a first terminal coupled to the second terminal of the fourth P-type transistor P4G, and a second terminal. The fourth N-type transistor N4G having a first terminal coupled to the second terminal of the fifth resistor R5G, a second terminal coupled to the second terminal of the second control circuit 530, and a control terminal coupled to the input terminal of the second control circuit 530.

The fifth P-type transistor P5G has a first terminal coupled to the input terminal of the second control circuit 530, a second terminal, and a control terminal coupled to the first terminal of the fifth resistor R5G. The sixth resistor R6G has a first terminal coupled to the second terminal of the fifth P-type transistor P5G, and a second terminal coupled to the second terminal of the second N-type transistor N2G. The fifth N-type transistor N5G has a first terminal coupled to the second terminal of the sixth resistor R6G, a second terminal coupled to the second terminal of the second control circuit, and a control terminal coupled to the first terminal of the fifth resistor R5G.

The sixth P-type transistor P6G has a first terminal coupled to the first terminal of the fourth resistor R4G, a second terminal, and a control terminal coupled to the second terminal of the sixth resistor R6G. The seventh resistor R7G has a first terminal coupled to the second terminal of the sixth P-type transistor P6G and the output terminal of the second control circuit 530, and a second terminal. The sixth N-type transistor N6G has a first terminal coupled to the second terminal of the seventh resistor R7G, a second terminal coupled to the second terminal of the second control circuit 530, and a control terminal coupled to the second terminal of the sixth resistor R6G.

That is, the first control circuit 520 can include three or more odd number sets of a P-type transistor and an N-type transistor for controlling the first primary transistors T1, and the second control circuit 530 can include three or more odd number sets of a P-type transistor and an N-type transistor for controlling the second primary transistors T2. With more sets of a P-type transistor and an N-type transistor, more current discharge paths can be provided. In addition, in some other embodiments, the first control circuit and the second control circuit can include even more odd number sets of a P-type transistor (s) and an N-type transistor (s) for controlling the primary transistors.

Figure 12:
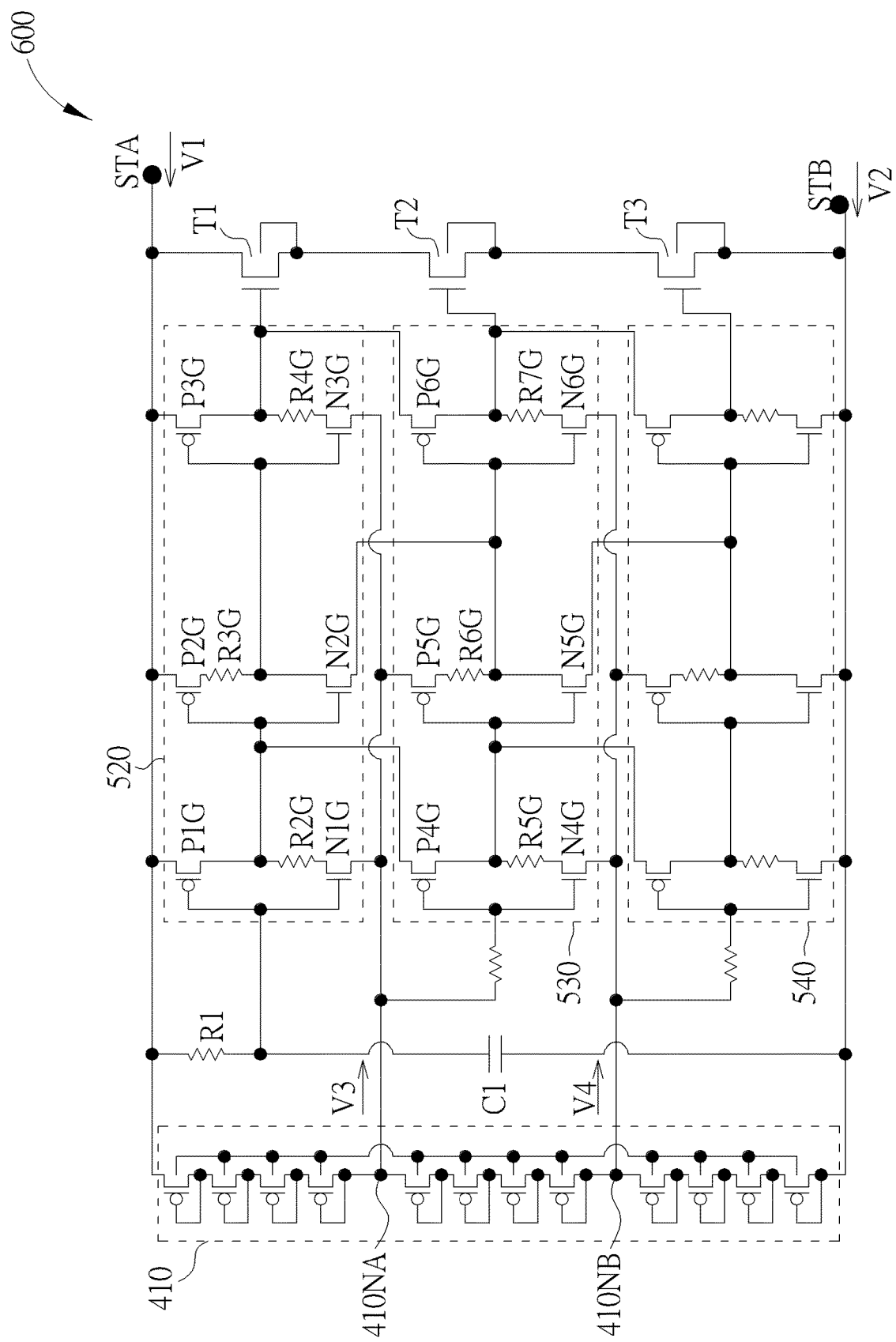
FIG. 12 shows an ESD protection device according to another embodiment of the present invention.

FIG. 12 shows an ESD protection device 600 according to one embodiment of the present invention. The ESD protection devices 500 and 600 have similar structures and can be operated with similar principles, and the ESD protection device 600 could provide higher operation voltage between the system terminals STA and STB than the ESD protection device 500. Moreover, the second control circuit 530 is coupled to the second system terminal through another control circuit 540, and the second primary transistors T2 is coupled to the second system terminal through another primary transistor T3. The voltage divider 410 can further provide the fourth voltage V4 through the second intermediate node 410NB. The control circuits 530 and 540 have similar structures and can be operated with similar principles.

In summary, the ESD protection device provided by the embodiments of the present invention can control the primary transistors by different control circuits with different voltage, allowing the ESD protection device to function with high operation voltages. Additionally, the control circuits could also provide current discharging paths for improving the performance of ESD protection.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electrostatic discharge protection device, comprising:
   a voltage divider coupled to a first system terminal for receiving a first voltage and a second system terminal for receiving a second voltage, and configured to provide at least one voltage between the first voltage and the second voltage;
   a first resistor having a first terminal coupled to the first system terminal, and a second terminal;
   a capacitor having a first terminal coupled to the second terminal of the first resistor, and a second terminal;
   a first primary transistor having a first terminal coupled to the first system terminal, a second terminal, and a control terminal;
   a second primary transistor having a first terminal coupled to the second terminal of the first primary transistor, a second terminal coupled to the second system terminal, and a control terminal;
   a first control circuit configured to turn on the first primary transistor when an electrostatic discharge event occurs, and the first control circuit comprising:
      a first terminal coupled to the first system terminal;
      an input terminal coupled to the second terminal of the first resistor;
      a second terminal coupled to the voltage divider for receiving a third voltage between the first voltage and the second voltage; and
      an output terminal coupled to the control terminal of the first primary transistor for controlling the first primary transistor; and
   a second control circuit configured to turn on the second primary transistor when the electrostatic discharge event occurs, and the second control circuit comprising:
      a first terminal coupled to the output terminal of the first control circuit;
      an input terminal coupled to the voltage divider for receiving a voltage between the first voltage and the second voltage;
      a second terminal coupled to the second system terminal;
      an output terminal coupled to the control terminal of the second primary transistor for controlling the second primary transistor;
      a second P-type transistor having a first terminal coupled to the first terminal of the second control circuit, a second terminal coupled to the output terminal of the second control circuit, and a control terminal coupled to the input terminal of the second control circuit; and
      a plurality of second N-type transistors coupled in series between the output terminal of the second control circuit and the second system terminal with control terminals of the plurality of second N-type transistors coupled to the input terminal of the second control circuit.

2. The electrostatic discharge protection device of claim 1, wherein the first control circuit further comprises:
   a first P-type transistor having a first terminal coupled to the first terminal of the first control circuit, a second terminal coupled to the output terminal of the first control circuit, and a control terminal coupled to the input terminal of the first control circuit; and
   a first N-type transistor having a first terminal coupled to the second terminal of the first P-type transistor, a second terminal coupled to the second terminal of the first control circuit, and a control terminal coupled to the input terminal of the first control circuit.

3. The electrostatic discharge protection device of claim 2, wherein:
   the first N-type transistor is disposed in a deep N-well coupled to the first terminal of the first control circuit;
   a body terminal of the first P-type transistor is coupled to the first terminal of the first control circuit; and
   a body terminal of the first N-type transistor is coupled to the second terminal of the first N-type transistor.

4. The electrostatic discharge protection device of claim 2, wherein the first control circuit further comprises:
   a second resistor coupled between the first terminal of the first N-type transistor and the output terminal of the first control circuit.

5. The electrostatic discharge protection device of claim 1, wherein:
   a channel length of the second P-type transistor is smaller than a channel length of each of the plurality of second N-type transistors; and
   a channel width of the second P-type transistor is greater than a channel width of each of the plurality of second N-type transistors.

6. The electrostatic discharge protection device of claim 1, wherein the second control circuit further comprises:
   at least one second P-type transistor, each having a first terminal coupled to the first terminal of the second control circuit, a second terminal coupled to the output terminal of the second control circuit, and a control terminal coupled to the input terminal of the second control circuit.

7. The electrostatic discharge protection device of claim 6, wherein:
   body terminals of the plurality of second N-type transistors are coupled to the second system terminal.

8. The electrostatic discharge protection device of claim 1, further comprising:
- a first gate resistor coupled between the input terminal of the first control circuit and the voltage divider; and
- a second gate resistor coupled between the input terminal of the second control circuit and the voltage divider.

9. The electrostatic discharge protection device of claim 1, further comprising:
- a third gate resistor coupled between the control terminal of the first primary transistor and the second terminal of the first primary transistor; and
- a fourth gate resistor coupled between the control terminal of the second primary transistor and the second terminal of the second primary transistor.

10. The electrostatic discharge protection device of claim 1, wherein:
- the first primary transistor is disposed in a deep N-well coupled to the first system terminal;
- a body terminal of the first primary transistor is coupled to the second terminal of the first primary transistor; and
- a body terminal of the second primary transistor is coupled to the second terminal of the second primary transistor.

11. The electrostatic discharge protection device of claim 1, wherein the voltage divider comprises:
- a first voltage gap circuit coupled to the first system terminal and a first intermediate node for providing the third voltage; and
- a second voltage gap circuit coupled to the first intermediate node and the second system terminal;
- wherein the input terminal of the second control circuit is coupled to the first intermediate node for receiving the third voltage.

12. The electrostatic discharge protection device of claim 11, wherein:
- the first voltage gap circuit comprises at least one first diode or at least one fourth resistor coupled in series between the first system terminal and the first intermediate node; and
- the second voltage gap circuit comprises at least one second diode or at least one fifth resistor coupled in series between the first intermediate node and the second system terminal.

13. The electrostatic discharge protection device of claim 1, wherein the voltage divider comprises:
- a first voltage gap circuit coupled to the first system terminal and a first intermediate node for providing the third voltage;
- a second voltage gap circuit coupled to the first intermediate node and a second intermediate node for providing a fourth voltage between the first voltage and the second voltage; and
- a third voltage gap circuit coupled to the second intermediate node and the second system terminal;
- wherein the input terminal of the second control circuit is coupled to the second intermediate node for receiving the fourth voltage.

14. The electrostatic discharge protection device of claim 1, wherein:
- the second terminal of the capacitor is coupled to the second system terminal; and
- the capacitor is implemented by a metal-oxide-metal capacitor or a metal-insulator-metal capacitor.

15. The electrostatic discharge protection device of claim 1, wherein:
- the second terminal of the capacitor is configured to receive the third voltage; and
- the capacitor is implemented by an N-type transistor, a P-type transistor, a metal-oxide-semiconductor varactor, a metal-oxide-metal capacitor or a metal-insulator-metal capacitor.

16. An electrostatic discharge protection device comprising:
- a voltage divider coupled to a first system terminal for receiving a first voltage and a second system terminal for receiving a second voltage, and configured to provide at least one voltage between the first voltage and the second voltage;
- a first resistor having a first terminal coupled to the first system terminal, and a second terminal;
- a capacitor having a first terminal coupled to the second terminal of the first resistor, and a second terminal;
- a first primary transistor having a first terminal coupled to the first system terminal, a second terminal, and a control terminal;
- a second primary transistor having a first terminal coupled to the second terminal of the first primary transistor, a second terminal coupled to the second system terminal, and a control terminal;
- a first control circuit configured to turn on the first primary transistor when an electrostatic discharge event occurs, and the first control circuit comprising:
  - a first terminal coupled to the first system terminal;
  - an input terminal coupled to the second terminal of the first resistor;
  - a second terminal coupled to the voltage divider for receiving a third voltage between the first voltage and the second voltage;
  - an output terminal coupled to the control terminal of the first primary transistor for controlling the first primary transistor;
  - a first P-type transistor having a first terminal coupled to the first terminal of the first control circuit, a second terminal coupled to the output terminal of the first control circuit, and a control terminal coupled to the input terminal of the first control circuit; and
  - a first N-type transistor having a first terminal coupled to the second terminal of the first P-type transistor, a second terminal coupled to the second terminal of the first control circuit, and a control terminal coupled to the input terminal of the first control circuit; and
- a second control circuit configured to turn on the second primary transistor when the electrostatic discharge event occurs, and the second control circuit comprising:
  - a first terminal coupled to the output terminal of the first control circuit;
  - an input terminal coupled to the voltage divider for receiving a voltage between the first voltage and the second voltage;
  - a second terminal coupled to the second system terminal; and
  - an output terminal coupled to the control terminal of the second primary transistor for controlling the second primary transistor;
- wherein:
  - a channel length of the first P-type transistor is smaller than a channel length of the first N-type transistor; and
  - a channel width of the first P-type transistor is greater than a channel width of the first N-type transistor.

17. An electrostatic discharge protection device comprising:
- a voltage divider coupled to a first system terminal for receiving a first voltage and a second system terminal for receiving a second voltage, and configured to provide at least one voltage between the first voltage and the second voltage;
- a first resistor having a first terminal coupled to the first system terminal, and a second terminal;
- a capacitor having a first terminal coupled to the second terminal of the first resistor, and a second terminal;
- a first primary transistor having a first terminal coupled to the first system terminal, a second terminal, and a control terminal;
- a second primary transistor having a first terminal coupled to the second terminal of the first primary transistor, a second terminal coupled to the second system terminal, and a control terminal;
- a first control circuit configured to turn on the first primary transistor when an electrostatic discharge event occurs, and the first control circuit comprising:
  - a first terminal coupled to the first system terminal;
  - an input terminal coupled to the second terminal of the first resistor;
  - a second terminal coupled to the voltage divider for receiving a third voltage between the first voltage and the second voltage;
  - an output terminal coupled to the control terminal of the first primary transistor for controlling the first primary transistor;
  - a plurality of first P-type transistors, each having a first terminal coupled to the first terminal of the first control circuit, a second terminal coupled to the output terminal of the first control circuit, and a control terminal coupled to the input terminal of the first control circuit; and
  - a plurality of first N-type transistors coupled in series between the output terminal and the second terminal of the first control circuit with control terminals of the plurality of first N-type transistors coupled to the input terminal of the first control circuit; and
- a second control circuit configured to turn on the second primary transistor when the electrostatic discharge event occurs, and the second control circuit comprising:
  - a first terminal coupled to the output terminal of the first control circuit;
  - an input terminal coupled to the voltage divider for receiving a voltage between the first voltage and the second voltage;
  - a second terminal coupled to the second system terminal; and
  - an output terminal coupled to the control terminal of the second primary transistor for controlling the second primary transistor.

18. The electrostatic discharge protection device of claim 17, wherein the second control circuit further comprises:
- a second P-type transistor having a first terminal coupled to the output terminal of the first control circuit, a second terminal coupled to the output terminal of the second control circuit, and a control terminal coupled to the input terminal of the second control circuit; and
- a second N-type transistor having a first terminal coupled to the output terminal of the second control circuit, a second terminal coupled to the second system terminal, and a control terminal coupled to the input terminal of the second control circuit.

19. The electrostatic discharge protection device of claim 18, wherein the second control circuit further comprises:
- a third resistor coupled between the first terminal of the second N-type transistor and the output terminal of the second control circuit.

* * * * *